(12) United States Patent
Oka et al.

(10) Patent No.: US 10,026,808 B2
(45) Date of Patent: Jul. 17, 2018

(54) SEMICONDUCTOR DEVICE INCLUDING INSULATING FILM THAT INCLUDES NEGATIVELY CHARGED MICROCRYSTAL

(71) Applicant: TOYODA GOSEI CO., LTD., Kiyosu-shi (JP)

(72) Inventors: Tohru Oka, Kiyosu (JP); Kazuya Hasegawa, Kiyosu (JP); Noriaki Murakami, Kiyosu (JP); Takahiro Sonoyama, Kiyosu (JP); Nariaki Tanaka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/604,265

(22) Filed: May 24, 2017

(65) Prior Publication Data

US 2017/0263701 A1    Sep. 14, 2017

Related U.S. Application Data

(63) Continuation of application No. 14/958,834, filed on Dec. 3, 2015, now Pat. No. 9,691,846.

(30) Foreign Application Priority Data

Dec. 9, 2014 (JP) ................. 2014-248846

(51) Int. Cl.
*H01L 29/06* (2006.01)
*H01L 29/861* (2006.01)
(Continued)

(52) U.S. Cl.
CPC .... *H01L 29/0638* (2013.01); *H01L 21/02356* (2013.01); *H01L 29/2003* (2013.01);
(Continued)

(58) Field of Classification Search
CPC ....... H01L 27/2454; H01L 2924/12032; H01L 29/66143; H01L 29/66212;
(Continued)

(56) References Cited

U.S. PATENT DOCUMENTS

| 2002/0195643 A1 | 12/2002 | Harada |
| 2003/0030117 A1 | 2/2003 | Iwasaki |
| 2011/0048769 A1 | 3/2011 | Fujiwara |
| 2011/0193095 A1 | 8/2011 | Nakata et al. |

(Continued)

FOREIGN PATENT DOCUMENTS

| JP | 2003-059926 A | 2/2003 |
| JP | 2004-087848 A | 3/2004 |

(Continued)

OTHER PUBLICATIONS

Japanese Office Action dated Aug. 15, 2017 with an English translation.

*Primary Examiner* — Tucker J Wright
(74) *Attorney, Agent, or Firm* — McGinn IP Law Group, PLLC

(57) ABSTRACT

A semiconductor device includes a substrate, a semiconductor layer that is formed on the substrate and includes a pn junction or a hetero-junction, an insulating film that is formed on the semiconductor layer to be in contact with an end of the pn junction or an end of the hetero-junction, and an electrode formed on the semiconductor layer. The insulating film includes an insulating layer that is mainly made of negatively charged microcrystal.

13 Claims, 9 Drawing Sheets

(51) Int. Cl.
*H01L 29/20* (2006.01)
*H01L 21/02* (2006.01)
*H01L 29/40* (2006.01)
*H01L 29/872* (2006.01)
*H01L 29/66* (2006.01)
*H01L 29/778* (2006.01)

(52) U.S. Cl.
CPC .......... *H01L 29/402* (2013.01); *H01L 29/408* (2013.01); *H01L 29/66204* (2013.01); *H01L 29/66212* (2013.01); *H01L 29/7786* (2013.01); *H01L 29/8611* (2013.01); *H01L 29/8613* (2013.01); *H01L 29/872* (2013.01)

(58) Field of Classification Search
CPC .......... H01L 29/872–29/8725; H01L 27/0766; H01L 51/0579; H01L 2924/12036; H01L 29/66136; H01L 29/8613; H01L 29/0603; H01L 29/8611; H01L 29/2003
See application file for complete search history.

(56) References Cited

U.S. PATENT DOCUMENTS

| | | |
|---|---|---|
| 2013/0240896 A1 | 9/2013 | Ozaki |
| 2013/0264576 A1 | 10/2013 | Onizawa |
| 2013/0328120 A1 | 12/2013 | Ueno et al. |
| 2014/0306311 A1 | 10/2014 | Funao |
| 2015/0060873 A1 | 3/2015 | Chiu |
| 2015/0102431 A1 | 4/2015 | Chi |

FOREIGN PATENT DOCUMENTS

| | | |
|---|---|---|
| JP | 2005-005486 A | 1/2005 |
| JP | 2006-253520 A | 9/2006 |
| JP | 2008-218696 A | 9/2008 |
| JP | 2009-059912 A | 3/2009 |
| JP | 2010-056100 A | 3/2010 |
| JP | 2010-098141 A | 4/2010 |
| JP | 2011-071247 A | 4/2011 |
| JP | 2012-114317 A | 6/2012 |
| JP | 2013-197220 A | 9/2013 |
| JP | 2013-214692 A | 10/2013 |
| JP | 2013-258251 A | 12/2013 |
| JP | 2014-013886 A | 1/2014 |
| WO | WO 2013/080769 A1 | 6/2013 |

Fig.3

| ANNEAL TREATMENT TIME | 5 min | 10 min | 30 min | 60 min |
|---|---|---|---|---|
| AMOUNT OF INCREASE OF NEGATIVE CHARGE IN $Al_2O_3$ [$cm^{-2}$] | $-3.0 \times 10^{11}$ | $-5.9 \times 10^{11}$ | $-9.0 \times 10^{11}$ | $-1.5 \times 10^{12}$ |
| AMOUNT OF INCREASE OF NEGATIVE CHARGE IN $ZrO_2$ [$cm^{-2}$] | $-1.5 \times 10^{12}$ | $-2.5 \times 10^{12}$ | $-4.5 \times 10^{12}$ | $-7.5 \times 10^{12}$ |

ANNEAL TREATMENT TEMPERATURE: FIXED (400°C)

Fig.4

| ANNEAL TREATMENT TIME | 400°C | 650°C | 900°C |
|---|---|---|---|
| AMOUNT OF INCREASE OF NEGATIVE CHARGE IN $Al_2O_3$ [$cm^{-2}$] | $-6.0 \times 10^{11}$ | $-2.7 \times 10^{12}$ | – |
| AMOUNT OF INCREASE OF NEGATIVE CHARGE IN $ZrO_2$ [$cm^{-2}$] | $-2.5 \times 10^{12}$ | $-8.6 \times 10^{12}$ | – |

ANNEAL TREATMENT TIME: FIXED (10 min)

SEMICONDUCTOR DEVICE INCLUDING INSULATING FILM THAT INCLUDES NEGATIVELY CHARGED MICROCRYSTAL

This Application is a Continuation Application of U.S. patent application Ser. No. 14/958,834, which was filed on Dec. 3, 2015, and the disclosure of which is incorporated herein in its entirety by reference thereto.

CROSS-REFERENCE TO RELATED APPLICATION

The present application claims priority from Japanese patent application P2014-248846 filed on Dec. 9, 2014, the entirety of disclosures of which is hereby incorporated by reference into this application.

BACKGROUND

1. Technical Field

The present invention relates to a semiconductor device and a manufacturing method of the same.

2. Related Art

A semiconductor device (semiconductor element) is required to reduce the potential crowding that occurs in the peripheries of a semiconductor layer and an electrode and thereby reduce the reverse leakage current. Especially in a semiconductor device used as power device, it is important to reduce the potential crowding and thereby reduce the reverse leakage current, in order to improve the breakdown voltage.

Patent Literatures 1 and 2 respectively describe a technique that reduces the potential crowding occurring at an end of a Schottky electrode in a Schottky diode by using a field plate structure. Patent Literature 3 describes a field plate structure provided by a nitride insulating layer having a positive fixed charge density lower than $1.2 \times 10^{12}$ cm$^{-2}$ at an interface with a semiconductor layer in a gallium nitride-based Schottky diode.

Non-Patent Literature 1 describes a technique that reduces the potential crowding occurring at an end of a pn junction that is exposed on a side face of an element isolation structure formed by dry etching, by using a field plate structure.

Patent Literature 4 describes a technique that injects negatively charged particles into an insulating film that is formed to cover the surface of a p-type semiconductor layer exposed by dry etching, in a group III nitride-based semiconductor device, in order to prevent a change from the surface of the p-type semiconductor layer to an n-type.

CITATION LIST

Patent Literature 1: JP 2005-5486A
Patent Literature 2: JP 2009-59912A
Patent Literature 3: JP 2010-56100A
Patent Literature 4: JP 2012-114317A
Non-Patent Literature 1: Physica Status Solidi (a), Applications and Materials Science, Kazuki Nomoto et al., the USA, July 2011, Vol. 208, pages 1535-1537

SUMMARY

The field plate structures described in Patent Literatures 1 to 3 and Non-Patent Literature 1, however, have difficulty in sufficiently reducing the potential crowding and thereby fail to sufficiently reduce the reverse leakage current.

In the technique of injecting the charged particles in the insulating film described in Patent Literature 4, there is a possibility that the charged particles are injected deeper into the p-type semiconductor layer in the process of injecting the charged particles in the insulating film. Injecting the charged particles into the p-type semiconductor layer would rather increase the reverse leakage current. In the technique described in Patent Literature 4, the increase in distance of the position where the charged particles are injected in the insulating film from the p-type semiconductor layer in order to prevent injection of the charged particles into the p-type semiconductor layer leads to increase the amount of charged particles required for introducing holes in the p-type semiconductor layer. In the case where the amount of charged particles is increased in the insulating film, these charged particles may form a leakage path in the insulating film. This may result in decreasing the breakdown voltage of the insulating film and thereby decreasing the overall breakdown voltage of the semiconductor device.

Accordingly there is a need to provide a technique that sufficiently reduces the reverse leakage current in a semiconductor device. With respect to the semiconductor device, other needs include cost reduction, miniaturization, easy manufacture, resource saving, improvement of usability and improvement of durability.

In order to solve at least part of the problems described above, the invention may be implemented by the following aspects.

(1) According to one aspect of the invention, there is provided a semiconductor device. The semiconductor device comprises a semiconductor layer; and an insulating film that is formed on the semiconductor layer. The insulating film includes an insulating layer that is mainly made of negatively charged microcrystal. This aspect of the semiconductor device causes depletion on the surface of the semiconductor layer by the negative charge of the insulating layer mainly made of microcrystal in the insulating film. This sufficiently reduces the potential crowding on the surface of the semiconductor layer and thereby sufficiently reduces the reverse leakage current.

(2) In the semiconductor device of the above aspect, the insulating layer may be formed adjacent to the semiconductor layer. Compared with a structure that the insulating layer is formed away from the semiconductor layer, the structure of this aspect further accelerates depletion on the surface of the semiconductor layer by the negative charge of the insulating layer. This further reduces the potential crowding on the surface of the semiconductor layer and thereby further reduces the reverse leakage current.

(3) In the semiconductor device of the above aspect, the insulating film may further include another insulating layer mainly made of an amorphous material. This another insulating layer may be formed adjacent to the semiconductor layer, and the insulating layer may be formed on this another insulating layer. This aspect improves the breakdown voltage of the insulating film by the presence of this another insulating layer.

(4) In the semiconductor device of the above aspect, the negative charge of the insulating layer may be fixed charge. Unlike negative charge by the interface state, this aspect allows for depletion on the surface of the semiconductor layer without delay relative to application of a voltage.

(5) In the semiconductor device of the above aspect, the insulating layer may be formed to have an absolute value of negative charge density that is equal to or higher than $1 \times 10^{12}$ cm$^{-2}$. This aspect effectively reduces the reverse leakage current.

(6) In the semiconductor device of the above aspect, a distance from the semiconductor layer to the insulating layer may be equal to or less than 0.5 μm. This aspect effectively reduces the reverse leakage current.

(7) In the semiconductor device of the above aspect, the insulating layer may have a relative permittivity of 6 or higher and may contain at least one compound selected from the group consisting of aluminum (Al), hafnium (Hf), zirconium (Zr), tantalum (Ta) and titanium (Ti). This aspect facilitates formation of the insulating layer mainly made of negatively charged microcrystal.

(8) In the semiconductor device of the above aspect, the insulating layer may be mainly made of an oxide. Using the oxide facilitates formation of the insulating layer mainly made of negatively charged microcrystal by anneal treatment, compared with using a nitride or a silicide.

(9) In the semiconductor device of the above aspect, the insulating layer may be mainly made of at least one of aluminum oxide ($Al_2O_3$), hafnium oxide ($HfO_2$) and zirconium oxide ($ZrO_2$). This aspect facilitates formation of the insulating layer mainly made of negatively charged microcrystal.

(10) In the semiconductor device of the above aspect, the semiconductor layer may include an n-type semiconductor layer, and the insulating film may be formed on the n-type semiconductor layer. This aspect sufficiently reduces the potential crowding on the surface of the n-type semiconductor layer and thereby sufficiently reduces the reverse leakage current.

(11) In the semiconductor device of the above aspect, the insulating film may have an opening and may further include an electrode that is formed from on the n-type semiconductor layer to on the insulating film inside of the opening in the insulating film. This aspect sufficiently reduces the reverse leakage current in a field plate structure provided by the electrode, the insulating film and the n-type semiconductor layer.

(12) In the semiconductor device of the above aspect, the semiconductor layer may include an n-type semiconductor layer and a p-type semiconductor layer that is joined with the n-type semiconductor layer, and the insulating film may be formed at a pn junction where the n-type semiconductor layer is joined with the p-type semiconductor layer. This aspect sufficiently reduces the reverse leakage current at the pn junction.

(13) In the semiconductor device of the above aspect, the semiconductor layer may have a stepped portion that is recessed in a thickness direction, and the insulating film may be formed on at least part of the stepped portion. This aspect sufficiently reduces the reverse leakage current at the stepped portion.

(14) In the semiconductor device of the above aspect, the semiconductor layer may be mainly made of a group III nitride. This aspect sufficiently reduces the reverse leakage current in a group III nitride-based semiconductor device.

(15) According to another aspect of the invention, there is provided a manufacturing method of a semiconductor device. The manufacturing method comprises forming a semiconductor layer; forming an insulating layer as at least part of an insulating film formed on the semiconductor layer; and performing anneal treatment of the insulating layer to prompt microcrystallization of the insulating layer and increase negative charge of the insulating layer. This aspect causes depletion on the surface of the semiconductor layer by the negative charge of the insulating layer mainly made of microcrystal in the insulating film. This sufficiently reduces the potential crowding on the surface of the semiconductor layer and thereby sufficiently reduces the reverse leakage current.

(16) In the manufacturing method of the above aspect, the anneal treatment may be performed to heat the insulating layer at an anneal treatment temperature that is between a temperature at which the insulating layer is formed and a temperature at which bubbles are generated in the insulating layer, inclusive. This aspect prompts microcrystallization of the insulating layer, while preventing damage of the insulating layer.

(17) In the manufacturing method of the above aspect, the anneal treatment temperature may be between 350° C. and 800° C., inclusive. This aspect efficiently forms the insulating layer mainly made of negatively charged microcrystal.

The invention may be implemented by any of various aspects other than the semiconductor device and its manufacturing method of the above aspects, for example, an electric appliance including the semiconductor device of the above aspect incorporated therein or an apparatus for manufacturing the semiconductor device.

According to the above aspects of the invention, the negative charge of the insulating layer mainly made of microcrystal in the insulating film causes depletion on the surface of the semiconductor layer. This sufficiently reduces the potential crowding on the surface of the semiconductor layer and thereby sufficiently reduces the reverse leakage current.

BRIEF DESCRIPTION OF DRAWINGS

The invention will be described with reference to the accompanying drawings in which:

FIG. 3 is a table showing the results of evaluation on the amount of increase of negative charge in insulating layers with respect to various anneal treatment times;

FIG. 4 is a table showing the results of evaluation on the amount of increase of negative charge in the insulating layers with respect to various anneal treatment temperatures;

DESCRIPTION OF EMBODIMENTS

A. First Embodiment

A-1. Structure of Semiconductor Device

Figure 1:
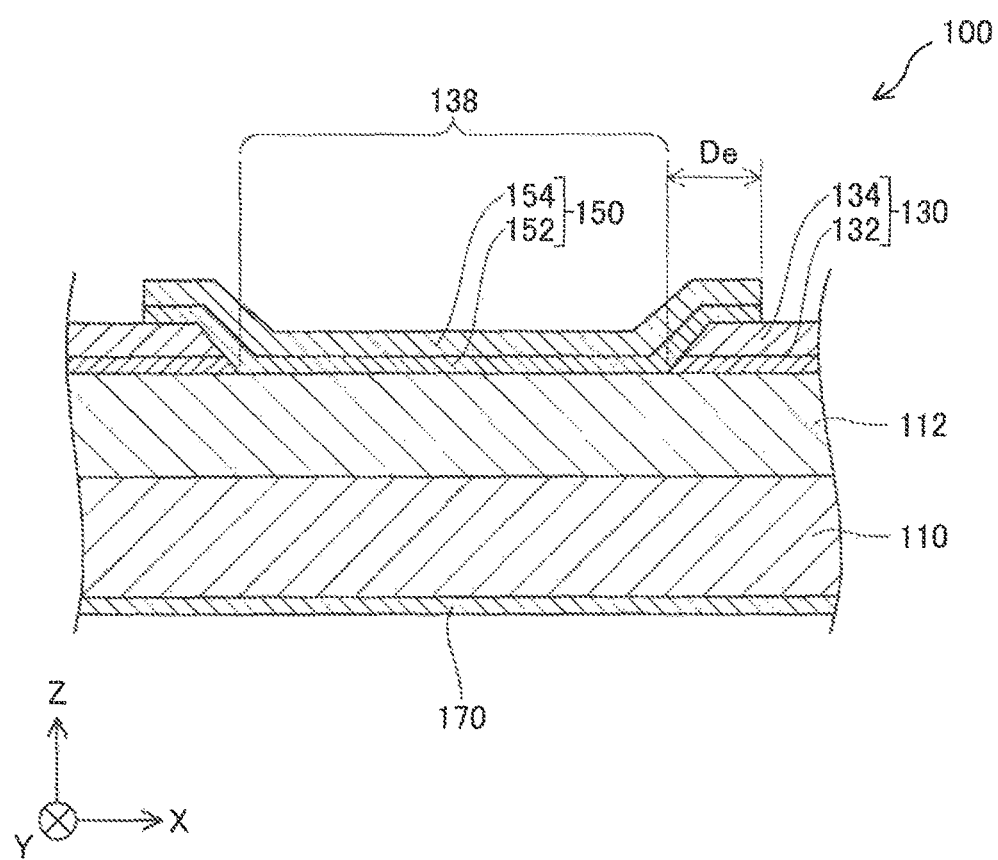
FIG. 1 is a sectional view schematically illustrating the structure of a semiconductor device according to a first embodiment.

FIG. 1 is a sectional view schematically illustrating the structure of a semiconductor device 100 according to a first embodiment. XYZ axes orthogonal to one another are illustrated in FIG. 1. Among the XYZ axes in FIG. 1, the X axis is an axis going from the left side of the sheet surface to the right side of the sheet surface of FIG. 1; +X-axis direction is a direction going rightward on the sheet surface and −X-axis direction is a direction going leftward on the sheet surface. Among the XYZ axes in FIG. 1, the Y axis is an axis going from the front side of the sheet surface to the rear side of the sheet surface of FIG. 1; +Y-axis direction is a direction going backward on the sheet surface and −Y-axis direction is a direction going forward on the sheet surface. Among the XYZ axes in FIG. 1, the Z axis is an axis going from the lower side of the sheet surface to the upper side of the sheet surface of FIG. 1; +Z-axis direction is a direction going upward on the sheet surface and −Z-axis direction is a direction going downward on the sheet surface.

According to this embodiment, the semiconductor device 100 is a GaN-based semiconductor device formed by using gallium nitride (GaN). According to this embodiment, the semiconductor device 100 is a vertical Schottky barrier diode. According to this embodiment, the semiconductor device 100 is used for power control and is also called power device. The semiconductor device 100 includes a substrate 110, a semiconductor layer 112, an insulating film 130, an anode electrode 150 and a cathode electrode 170.

The substrate 110 of the semiconductor device 100 is a semiconductor formed in a plate-like shape extended along both the X axis and the Y axis. According to this embodiment, the substrate 110 is mainly made of gallium nitride (GaN). In the description of this specification, the wording "mainly made of gallium nitride (GaN)" means containing gallium nitride (GaN) at a molar fraction of 90% or higher. According to this embodiment, the substrate 110 is an n-type semiconductor containing silicon (Si) as the donor element. According to this embodiment, the average concentration of silicon (Si) included in the substrate 110 is about $1 \times 10^{18}$ $cm^{-3}$.

The semiconductor layer 112 of the semiconductor device 100 is an n-type semiconductor layer located on the +Z-axis direction side of the substrate 110 and extended along the X axis and the Y axis. According to this embodiment, the semiconductor layer 112 is mainly made of gallium nitride (GaN). According to this embodiment, the semiconductor layer 112 contains silicon (Si) as the donor element. According to this embodiment, the average concentration of silicon (Si) included in the semiconductor layer 112 is about $8 \times 10^{15}$ $cm^{-3}$. According to this embodiment, the semiconductor layer 112 has thickness (length in the Z-axis direction) of about 10 μm (micrometers). According to this embodiment, the semiconductor layer 112 is a semiconductor layer formed by metal organic chemical vapor deposition (MOCVD).

The insulating film 130 of the semiconductor device 100 is a film that has electrical insulation properties and is formed on the semiconductor layer 112. According to this embodiment, the insulating film 130 serves as a passivating film to protect the surface of the semiconductor layer 112 and is arranged to cover the surface of the semiconductor layer 112. The insulating film 130 includes an insulating layer 132 and an insulating layer 134.

The insulating layer 132 of the insulating film 130 is an insulating layer mainly made of negatively charged microcrystal. In the description of this specification, the wording "mainly made of microcrystal" means containing microcrystal at a volume ratio of 90% or higher. According to this embodiment, the negative charge of the insulating layer 132 is fixed charge. The absolute value of the negative charge density in the insulating layer 132 is preferably equal to or higher than $1 \times 10^{12}$ $cm^{-2}$, is more preferably equal to or higher than $5 \times 10^{12}$ $cm^{-2}$ and is furthermore preferably equal to or higher than $1 \times 10^{13}$ $cm^{-2}$. In terms of ensuring the sufficient electrical insulation properties of the insulating film 130, on the other hand, the absolute value of the negative charge density in the insulating layer 132 is preferably equal to or lower than $1 \times 10^{16}$ $cm^{-2}$.

According to this embodiment, the insulating layer 132 has relative permittivity of 6 or higher. According to this embodiment, the insulating layer 132 is mainly made of aluminum oxide ($Al_2O_3$) that is an oxide of aluminum (Al). In the description of this specification, the wording "mainly made of aluminum oxide ($Al_2O_3$)" means containing aluminum oxide ($Al_2O_3$) at a molar fraction of 90% or higher.

According to this embodiment, the insulating layer 132 is formed on the semiconductor layer 112 to be adjacent to the semiconductor layer 112. According to this embodiment, the insulating layer 132 has thickness (length in the Z-axis direction) of about 100 nm (nanometer). According to this embodiment, the insulating layer 132 is a film of insulating layer formed by atomic layer deposition (ALD) and subsequently subjected to anneal treatment. According to this embodiment, the conditions of anneal treatment of the insulating layer 132 are nitrogen ($N_2$) atmosphere, anneal treatment temperature of 400° C. and anneal treatment time of 30 minutes.

The insulating layer 134 of the insulating film 130 is another insulating film formed on the insulating layer 132 and mainly made of an amorphous material. According to this embodiment, the insulating layer 134 is mainly made of silicon dioxide ($SiO_2$). According to this embodiment, the insulating layer 134 has thickness (length in the Z-axis direction) of about 500 nm. According to this embodiment, the insulating layer 134 is a film of insulating layer formed by plasma chemical vapor deposition (plasma CVD).

The insulating film 130 has an opening 138 formed to pass through the insulating film 130. The opening 138 is a structure formed by removing part of the insulating film 130 from on the semiconductor layer 112 to make the semiconductor layer 112 exposed by wet etching.

The anode electrode 150 of the semiconductor device 100 is a Schottky electrode that is made of an electrically conductive material and is in Schottky junction with the semiconductor layer 112. The anode electrode 150 is formed on the semiconductor layer 112 inside of the opening 138 of the insulating film 130 to be extended to on the insulating film 130. A field plate structure is accordingly formed between the end of the anode electrode 150 and the semiconductor layer 112 across the insulating film 130. In terms of reducing potential crowding, a distance De between the end of the insulating film 130 and the end of the anode electrode 150 is preferably equal to or greater than 2 μm, is more preferably equal to or greater than 5 μm and is furthermore preferably equal to or greater than 10 μm. In terms of miniaturizing the semiconductor device 100, on the other hand, the distance De is preferably equal to or less than 1 mm (millimeter).

According to this embodiment, the anode electrode 150 includes an electrode layer 152 and an electrode layer 154.

The electrode layer 152 of the anode electrode 150 is formed on the semiconductor layer 112 inside of the opening 138 of the insulating film 130 to be extended to on the insulating film 130. According to this embodiment, the electrode layer 152 is mainly made of palladium (Pd). According to this embodiment, the electrode layer 152 has thickness (length in the Z-axis direction) of about 20 nm. The electrode layer 154 of the anode electrode 150 is formed on the electrode layer 152. According to this embodiment, the electrode layer 154 is mainly made of gold (Au). According to this embodiment, the electrode layer 154 has thickness (length in the Z-axis direction) of about 200 nm. According to this embodiment, the electrode layer 152 and the electrode layer 154 are conductive layers formed by electron beam evaporation.

The cathode electrode 170 of the semiconductor device 100 is an ohmic electrode that is made of an electrically conductive material and is in ohmic junction with the −Z axis direction side of the substrate 110. According to this embodiment, the cathode electrode 170 is an electrode formed by stacking a layer made of aluminum (Al) on a layer made of titanium (Ti) by electron beam evaporation.

A-2. Manufacturing Method of Semiconductor Device

Figure 2:
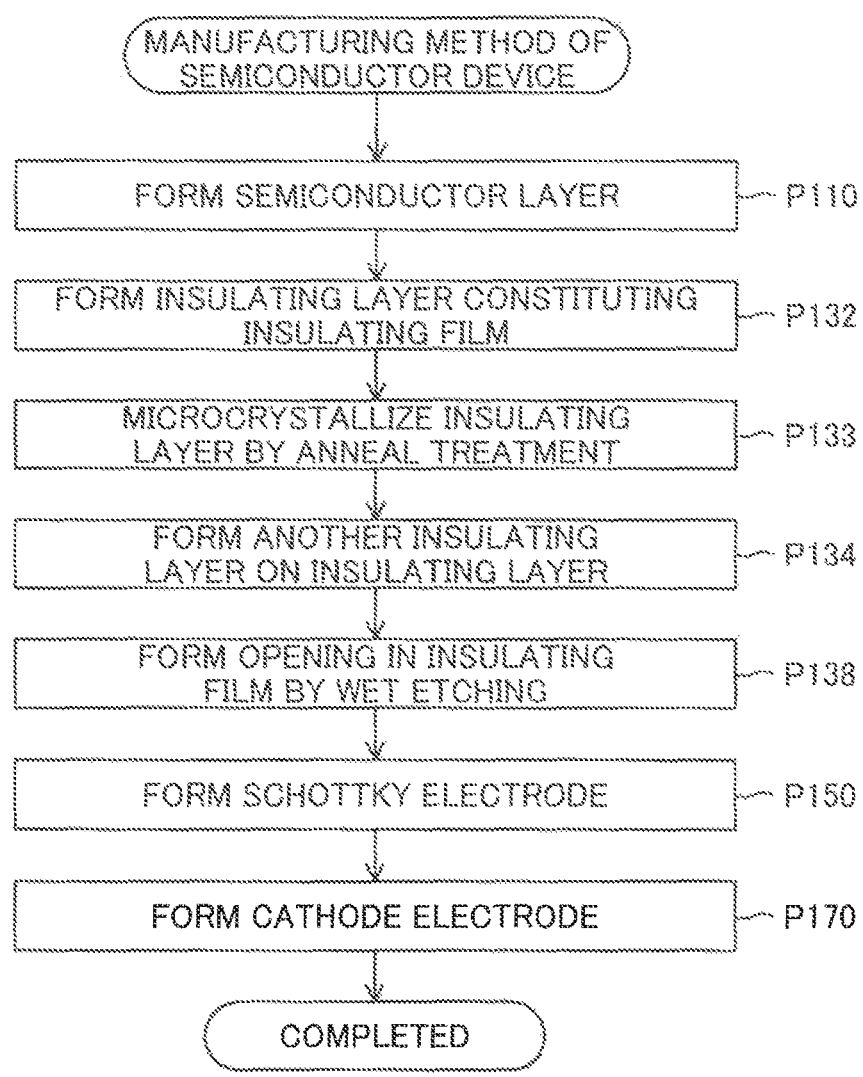
FIG. 2 is a flowchart showing a manufacturing method of the semiconductor device according to the first embodiment.

FIG. 2 is a flowchart showing a manufacturing method of the semiconductor device 100 according to the first embodiment. The manufacturer of the semiconductor device 100 first forms the semiconductor layer 112 on the substrate 110 by epitaxial growth (process P110). According to this embodiment, the manufacturer forms the semiconductor layer 112 by epitaxial growth using an MOCVD device for metal organic chemical vapor deposition (MOCVD).

After forming the semiconductor layer 112 (process P110), the manufacturer forms a film of insulating layer 132 on the semiconductor layer 112 (process P132). According to this embodiment, the insulating layer 132 is mainly made of aluminum oxide ($Al_2O_3$) that is an oxide of aluminum (Al) and has relative permittivity of 6 or higher. According to this embodiment, the manufacturer forms the film of insulating layer 132 by atomic layer deposition (ALD). According to this embodiment, the insulating layer 132 has thickness of about 100 nm.

After forming the film of insulating layer 132 (process P132), the manufacturer performs anneal treatment of the insulating layer 132, so as to prompt microcrystallization of the insulating layer 132 and increase the negative charge of the insulating layer 132 (process P133). The anneal treatment may be performed to heat the insulating layer 132 at an anneal treatment temperature that is between a temperature at which the film of insulating layer 132 is formed and a temperature at which bubbles are generated in the insulating layer 132, inclusive. More specifically, the anneal treatment temperature may be between 350° C. and 800° C., inclusive. According to this embodiment, the manufacturer performs anneal treatment of the insulating layer 132 under the conditions of nitrogen ($N_2$) atmosphere, anneal treatment temperature of 400° C. and anneal treatment time of 30 minutes. In terms of reducing the potential crowding, the absolute value of the negative charge density in the insulating layer 132 after anneal treatment is preferably equal to or higher than $1 \times 10^{12}$ cm$^{-2}$, is more preferably equal to or higher than $5 \times 10^{12}$ cm$^{-2}$ and is furthermore preferably equal to or higher than $1 \times 10^{13}$ cm$^{-2}$. In terms of ensuring the sufficient electrical insulation properties of the insulating film 130, on the other hand, the absolute value of the negative charge density in the insulating layer 132 is preferably equal to or lower than $1 \times 10^{16}$ cm$^{-2}$.

After performing anneal treatment (process P133), the manufacturer forms a film of insulating layer 134 on the insulating layer 132 (process P134). This forms the insulating film 130 of the stacked insulating layer 132 and insulating layer 134 on the semiconductor layer 112. According to this embodiment, the insulating layer 134 is mainly made of silicon dioxide ($SiO_2$). According to this embodiment, the manufacturer forms the film of insulating layer 134 by plasma chemical vapor deposition (plasma CVD). According to this embodiment, the insulating layer 134 has thickness of about 500 nm. According to another embodiment, the manufacturer may form a film of insulating layer 134 (process P134) prior to anneal treatment of the insulating layer 132 (process P133) and may subsequently perform anneal treatment (process P133). This modification similarly increases the negative charge of the insulating layer 132.

After forming the insulating film 130 (process P134), the manufacturer forms the opening 138 in the insulating film 130 by wet etching (process P138). According to this embodiment, the manufacturer forms a mask pattern on the insulating film 130 by photoresist and subsequently removes part of the insulating film 130 using a hydrofluoric acid-based etching solution, so as to form the opening 138 in the insulating film 130. According to this embodiment, the manufacturer removes the mask pattern formed on the insulating film 130 after forming the opening 138 in the insulating film 130.

After forming the opening 138 in the insulating film 130 (process P138), the manufacturer forms the anode electrode 150 as the Schottky electrode on the semiconductor layer 112 inside of the opening 138 of the insulating film 130 to be extended to on the insulating film 130 (process P150). According to this embodiment, the manufacturer forms the anode electrode 150 by lift-off method. More specifically, the manufacturer forms a mask pattern on the insulating film 130 by photoresist. The manufacturer then sequentially forms a film of electrode layer 152 mainly made of palladium (Pd) and a film of electrode layer 154 mainly made of gold (Au) by electron beam evaporation. The manufacturer subsequently removes the mask pattern from on the insulating film 130 with leaving the anode electrode 150 formed by stacking the electrode layer 154 on the electrode layer 152. This forms the anode electrode 150 in the opening 138 of the insulating film 130.

After forming the anode electrode 150 (process P150), the manufacturer forms the cathode electrode 170 as the ohmic electrode on the −Z-axis direction side of the substrate 110 (process P170). According to this embodiment, the manufacturer forms the cathode electrode 170 by stacking a layer made of aluminum (Al) on a layer made of titanium (Ti) by electron beam evaporation. According to another embodiment, the manufacturer may form the cathode electrode 170 (process P170) prior to forming the anode electrode (process P150). The semiconductor device 100 is completed through the above series of processes.

A-3. First Evaluation Test

FIG. 3 is a table showing the results of evaluation on the amount of increase of negative charge in insulating layers with respect to various anneal treatment times. FIG. 4 is a table showing the results of evaluation on the amount of increase of negative charge in the insulating layers with respect to various anneal treatment temperatures.

In a first evaluation test, the examiner produced a plurality of samples in which an insulating layer is formed on a substrate and performed anneal treatment of the respective samples with varying the anneal treatment time and with varying the anneal treatment temperature. The anneal treatment was performed under the following conditions:

<Conditions of Anneal Treatment in Evaluation Test of FIG. 3>

Atmosphere of anneal treatment: nitrogen ($N_2$)

Anneal treatment time: 5 minutes, 10 minutes, 30 minutes, 60 minutes

Anneal treatment temperature: 400° C. (fixed)

<Conditions of Anneal Treatment in Evaluation Test of FIG. 4>

Atmosphere of anneal treatment: nitrogen ($N_2$)

Anneal treatment time: 10 minutes (fixed)

Anneal treatment temperature: 400° C., 650° C. and 900° C.

The substrate of the sample is an n-type semiconductor mainly made of silicon (Si), and the insulating layer of the sample is mainly made of an oxide. The examiner produced a sample including an insulating layer mainly made of aluminum oxide ($Al_2O_3$) by atomic layer deposition (ALD) and produced a sample including an insulating layer mainly made of zirconium oxide ($ZrO_2$) by electron cyclotron resonance sputtering (ECR sputtering). After the anneal treatment, the examiner formed an electrode on the insulating layer by stacking a layer made of gold (Au) on a layer made of nickel (Ni), so as to produce a MOS (metal oxide semiconductor) structure. The examiner subsequently measured each MOS structure by C-V (capacity-voltage) measurement and calculated an amount of increase of negative charge in the insulating layer by the anneal treatment, based on the flat band voltage obtained from the result of measurement.

In the insulating layer mainly made of aluminum oxide ($Al_2O_3$), bubbles were generated by anneal treatment at temperature higher than about 800° C. In the insulating layer mainly made of zirconium oxide ($ZrO_2$), bubbles were generated by anneal treatment at temperature higher than about 700° C. The examiner confirmed a decrease in breakdown voltage with an increase in reverse leakage current in the sample with bubbles generated in the insulating film by anneal treatment. Accordingly the amount of increase of negative charge at the anneal treatment temperature of 900° C. is left blanks in the table of FIG. 4.

The results of evaluation of FIG. 3 show that the longer anneal treatment time more effectively increases the amount of increase of negative charge in the insulating layer. The results of evaluation of FIG. 4 show that the higher anneal treatment temperature in the range that bubbles are not generated in the insulating layer more effectively increases the amount of increase of negative charge in the insulating layer.

A-4. Second Evaluation Test

Figure 5:
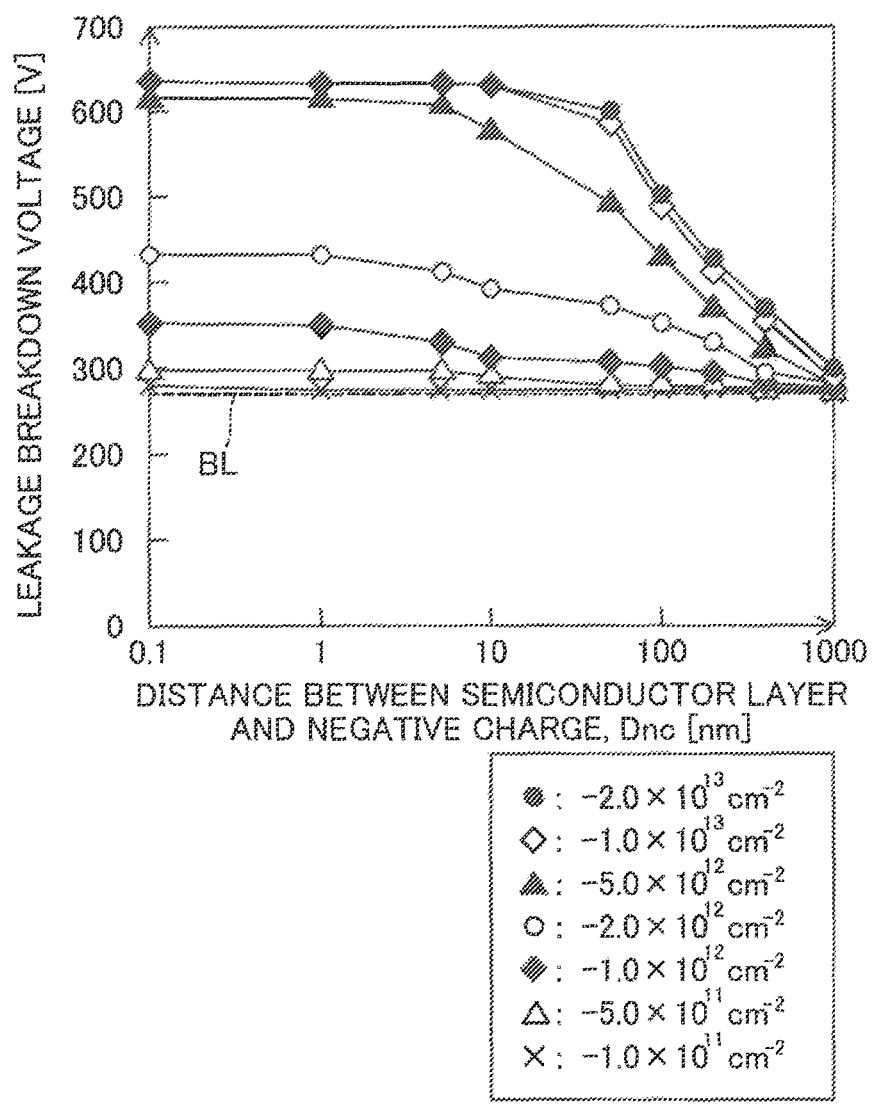
FIG. 5 is a graph showing results of evaluation with regard to effects of improvement in breakdown voltage of negatively charged insulating layers.

FIG. 5 is a graph showing results of evaluation with regard to effects of improvement in breakdown voltage of negatively charged insulating layers. In a second evaluation test, the examiner evaluated the effects of improvement in breakdown voltage of samples using a device simulator. The samples of the second evaluation test were semiconductor devices similar to the semiconductor device 100 of the first embodiment except the following differences:

Thickness of the semiconductor layer 112: 12 μm;

Average concentration of silicon (Si) included in the semiconductor layer 112: $6\times10^{15}$ cm$^{-3}$;

Insulating film 130: including only the insulating layer 132 (thickness of 1 μm) mainly made of aluminum oxide ($Al_2O_3$);

Absolute value of negative charge density in the insulating layer 132: 0 to $2\times10^{13}$ cm$^{-2}$; and Location of negative charge in the insulating layer 132: 0 to 1000 nm from surface of the semiconductor layer 112.

The abscissa of FIG. 5 shows distance Dnc between the semiconductor layer and the negative charge, and the ordinate of FIG. 5 shows leakage breakdown voltage of the sample that denotes the breakdown voltage at a reverse current density of 1 mA/cm$^2$. A broken line BL indicates a leakage breakdown voltage in the absence of negative charge in the insulating layer 132.

The results of the second evaluation test show that the leakage breakdown voltage increases with a decrease in distance Dnc. In other words, these results show that the shorter distance Dnc more effectively reduces the reverse leakage current. More specifically, the distance Dnc is preferably equal to or less than 0.5 μm (500 nm), is more preferably equal to or less than 0.1 μm (100 nm) and is furthermore preferably equal to or less than 0.01 μm (10 nm). The results of the second evaluation test also show that the leakage breakdown voltage increases with an increase in absolute value of negative charge density in the insulating layer 132. In other words, these results show that the larger absolute value of negative charge density in the insulating layer 132 more effectively reduces the reverse leakage current. More specifically, the absolute value of negative charge density in the insulating layer 132 is preferably equal to or higher than $1\times10^{12}$ cm$^{-2}$, is more preferably equal to or higher than $5\times10^{12}$ cm$^{-2}$ and is furthermore preferably equal to or higher than $1\times10^{13}$ cm$^{-2}$.

A-5. Third Evaluation Test

Figure 6:
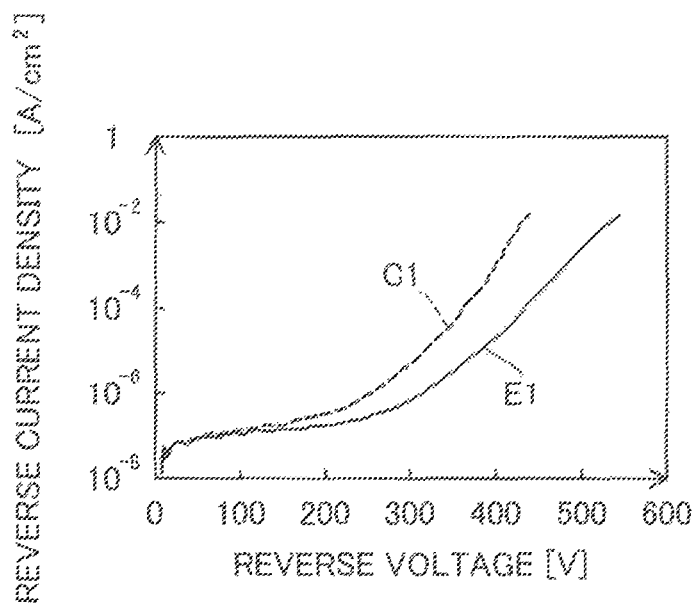
FIG. 6 is a graph showing results of evaluation with regard to effects of negatively charged insulating layers on reverse leakage characteristic.

FIG. 6 is a graph showing results of evaluation with regard to effects of negatively charged insulating layers on reverse leakage characteristic. In a third evaluation test, the examiner produced a sample E1 and a sample C1 as semiconductor devices subjected to evaluation and evaluated the reverse leakage characteristics of the respective samples. The sample E1 was a semiconductor device similar to the semiconductor device 100 of the first embodiment. The sample C1 was a semiconductor device similar to the semiconductor device 100 of the first embodiment except without performing anneal treatment of the insulating layer 132. The examiner measured reverse current density of each sample under application of a reverse voltage, in order to evaluate the reverse leakage characteristic. The abscissa of FIG. 6 shows the reverse voltage, and the ordinate of FIG. 6 shows the reverse current density.

As shown in FIG. 6, the reverse current density of the sample E1 is lower than the reverse current density of the sample C1 under application of an identical reverse voltage. This result may be attributed to that the negative charge in the insulating layer 132 is increased by anneal treatment of the insulating layer 132. An increase of the negative charge in the insulating layer 132 enhances depletion on the +Z-axis direction side surface of the semiconductor layer 112 and thereby reduces potential crowding on the surface of the semiconductor layer 112. This decreases the reverse current density and thereby reduces the reverse leakage current.

A-6. Advantageous Effects

In the first embodiment described above, the negative charge in the insulating layer 132 mainly made of microcrystal in the insulating film 130 causes depletion on the surface of the semiconductor layer 112. This sufficiently reduces the potential crowding on the surface of the semiconductor layer 112 near to the end of the anode electrode 150 and thereby sufficiently reduces the reverse leakage current.

The insulating layer 132 is formed adjacent to the semiconductor layer 112. Compared with a structure that the insulating layer 132 is formed away from the semiconductor layer 112, this structure further enhances depletion on the surface of the semiconductor layer 112 by the negative charge of the insulating layer 132. This accordingly further reduces the potential crowding on the surface of the semiconductor layer 112 and thereby further reduces the reverse leakage current.

The negative charge of the insulating layer 132 is fixed charge. Unlike negative charge by the interface state, this allows for depletion on the surface of the semiconductor layer 112 without delay relative to application of a voltage.

A-7. Modifications

A semiconductor device according to a modification of the first embodiment is similar to the semiconductor device 100 of the first embodiment, except that not the insulating layer 132 but the insulating layer 134 of the insulating film 130 is mainly made of negatively charged microcrystal. According to this modification, the insulating layer 132 is another insulating layer mainly made of an amorphous material. According to this modification, this another insulating layer improves the breakdown voltage of the insulating film 130. In the semiconductor device of this modification, in terms of reducing the potential crowding, the distance from the semiconductor layer 112 to the insulating layer 134 is preferably equal to or less than 0.5 μm (500 nm), is more preferably equal to or less than 0.1 μm (100 nm) and is furthermore preferably equal to or less than 0.01 μm (10 nm).

According to another modification of the first embodiment, the insulating layer mainly made of negatively charged microcrystal in the insulating film 130 may have relative permittivity equal to or higher than 6 and may contain at least one compound selected from the group consisting of aluminum (Al), hafnium (Hf), zirconium (Zr), tantalum (Ta) and titanium (Ti). This modification facilitates formation of the insulating layer mainly made of negatively charged microcrystal.

According to another modification of the first embodiment, the insulating layer mainly made of negatively charged microcrystal in the insulating film 130 may be mainly made of an oxide and more specifically may be mainly made of at least one of aluminum oxide ($Al_2O_3$), hafnium oxide ($HfO_2$) and zirconium oxide ($ZrO_2$). Such modification using the oxide facilitates formation of the insulating layer mainly made of negatively charged microcrystal by anneal treatment, compared with using a nitride or a silicide.

B. Second Embodiment

Figure 7:
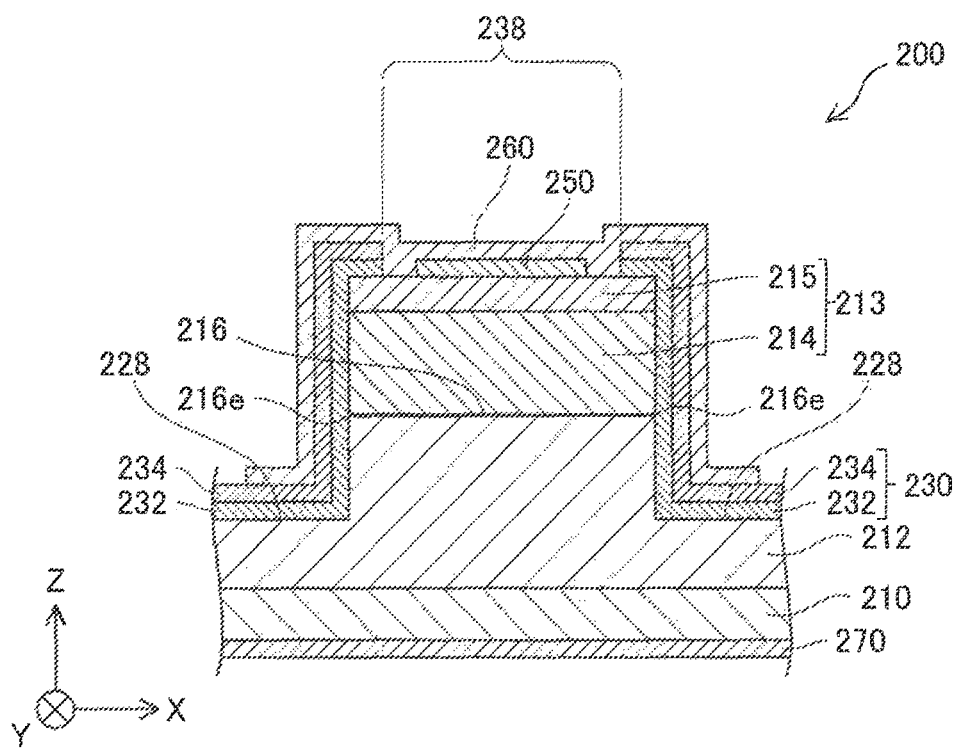
FIG. 7 is a sectional view schematically illustrating the structure of a semiconductor device according to a second embodiment.

FIG. 7 is a sectional view schematically illustrating the structure of a semiconductor device 200 according to a second embodiment. As in FIG. 1, XYZ axes are illustrated in FIG. 7. According to this embodiment, the semiconductor device 200 is a GaN-based semiconductor device formed by using gallium nitride (GaN). According to this embodiment, the semiconductor device 200 is a vertical pn junction diode. According to this embodiment, the semiconductor device 200 is used for power control and is also called power device. The semiconductor device 200 includes a substrate 210, a semiconductor layer 212, a semiconductor layer 213, an insulating film 230, an anode electrode 250, a field plate electrode 260 and a cathode electrode 270.

The substrate 210 of the semiconductor device 200 is a semiconductor formed in a plate-like shape extended along both the X axis and the Y axis. According to this embodiment, the substrate 210 is mainly made of gallium nitride (GaN). According to this embodiment, the substrate 210 is an n-type semiconductor containing silicon (Si) as the donor element.

The semiconductor layer 212 of the semiconductor device 200 is an n-type semiconductor layer located on the +Z-axis direction side of the substrate 210 and extended along the X axis and the Y axis. According to this embodiment, the semiconductor layer 212 is mainly made of gallium nitride (GaN). According to this embodiment, the semiconductor layer 212 contains silicon (Si) as the donor element. According to this embodiment, the semiconductor layer 212 is a semiconductor layer formed by metal organic chemical vapor deposition (MOCVD).

The semiconductor layer 213 of the semiconductor device 200 is a p-type semiconductor layer located on the +Z-axis direction side of the semiconductor layer 212 and extended along the X axis and the Y axis. According to this embodiment, the semiconductor layer 213 is mainly made of gallium nitride (GaN). According to this embodiment, the semiconductor layer 213 contains magnesium (Mg) as the acceptor element. According to this embodiment, the semiconductor layer 213 is a semiconductor layer formed by metal organic chemical vapor deposition (MOCVD).

According to this embodiment, the semiconductor layer 213 includes two semiconductor layers 214 and 215 having different carrier concentrations. The semiconductor layer 214 is stacked on the +Z-axis direction side of the semiconductor layer 212, and the semiconductor layer 215 is stacked on the +Z-axis direction side of the semiconductor layer 214. According to another embodiment, the semiconductor layer 213 may be configured as a single-layered structure or as a three or more semiconductor-layered structure.

The semiconductor device 200 has a stepped portion 228 that is recessed from the +Z-axis direction side of the semiconductor layer 213 into the semiconductor layer 212 in the thickness direction (Z-axis direction). The stepped portion 228 is provided as an element isolation structure (trench isolation structure) to isolate the semiconductor device 200 from another semiconductor device. According to this embodiment, the stepped portion 228 is a structure formed by removing part of the semiconductor layers 212 and 213 formed on the substrate 210 by dry etching.

A pn junction 216 is formed between the semiconductor layer 212 and the semiconductor layer 213. The pn junction 216 is an interface at which the semiconductor layer 212 of the n-type semiconductor is in junction with the semiconductor layer 213 of the p-type semiconductor. The pn junction 216 has an end 216e exposed on the stepped portion 228.

The insulating film 230 of the semiconductor device 200 is a film that has electrical insulation properties and is formed from the stepped portion 228 to the +Z-axis direction side surface of the semiconductor layer 213. According to this embodiment, the insulating film 230 serves as a passivating film to protect the surfaces of the semiconductor layers 212 and 213 and is arranged to cover the surfaces of the semiconductor layers 212 and 213. The insulating film 230 includes an insulating layer 232 and an insulating layer 234.

The insulating layer 232 of the insulating film 230 is an insulating layer mainly made of negatively charged microcrystal, like the insulating layer 132 of the first embodiment. According to this embodiment, the insulating layer 232 is mainly made of aluminum oxide ($Al_2O_3$) that is an oxide of aluminum (Al). According to this embodiment, the insulating layer 232 is formed from the stepped portion 228 to the +Z-axis direction side surface of the semiconductor layer 213 to be adjacent to the end 216e of the pn junction 216. According to this embodiment, the insulating layer 232 has thickness of about 100 nm. According to this embodiment, the insulating layer 232 is a film of insulating layer formed by atomic layer deposition (ALD) and subsequently subjected to anneal treatment. According to this embodiment, the conditions of anneal treatment of the insulating layer 232 are nitrogen ($N_2$) atmosphere, anneal treatment temperature of 400° C. and anneal treatment time of 30 minutes.

The insulating layer 234 of the insulating film 230 is another insulating film formed on the insulating layer 232 and mainly made of an amorphous material. According to this embodiment, the insulating layer 234 is mainly made of silicon dioxide ($SiO_2$). According to this embodiment, the insulating layer 234 has thickness of about 500 nm. According to this embodiment, the insulating layer 234 is a film of insulating layer formed by plasma chemical vapor deposition (plasma CVD).

The insulating film 230 has an opening 238 formed to pass through the insulating film 230 and to be extended to the +Z-axis direction side surface of the semiconductor layer 213. The opening 238 is a structure formed by removing part of the insulating film 230 from on the semiconductor layer 213 to make the semiconductor layer 213 exposed by wet etching.

The anode electrode 250 of the semiconductor device 200 is an ohmic electrode that is made of an electrically conductive material and is in ohmic junction with the +Z-axis direction side of the semiconductor layer 213. The anode electrode 250 is located inside of the opening 238 of the insulating film 230. According to this embodiment, the anode electrode 250 is an electrode formed by stacking a layer made of gold (Au) on a layer made of nickel (Ni) by electron beam evaporation and subsequently subjected to annealing process (anneal treatment).

The field plate electrode 260 of the semiconductor device 200 is an electrode made of an electrically conductive material and extended from inside of the opening 238 of the insulating film 230 including on the anode electrode 250 to on the insulating film 230. A field plate structure is accordingly formed at the stepped portion 228 between the field plate electrode 260 and the end 216e of the pn junction 216 across the insulating film 230. According to this embodiment, the field plate electrode 260 is formed by electron beam evaporation and is mainly made of aluminum (Al).

The cathode electrode 270 of the semiconductor device 200 is an ohmic electrode that is made of an electrically conductive material and is in ohmic junction with the −Z-axis direction side of the substrate 210. According to this embodiment, the cathode electrode 270 is an electrode formed by stacking a layer made of aluminum (Al) on a layer made of titanium (Ti) by electron beam evaporation and subsequently subjected to annealing process (anneal treatment).

In the second embodiment described above, the negative charge in the insulating layer 232 mainly made of microcrystal in the insulating film 230 causes depletion on the surface of the semiconductor layer 212. This sufficiently reduces the potential crowding on the surface of the semiconductor layer 212 near to the end 216e of the pn junction 216 and thereby sufficiently reduces the reverse leakage current.

The insulating layer 232 is formed adjacent to the semiconductor layer 212. Compared with a structure that the insulating layer 232 is formed away from the semiconductor layer 212, this structure further enhances depletion on the surface of the semiconductor layer 212 by the negative charge of the insulating layer 232. This accordingly further reduces the potential crowding on the surface of the semiconductor layer 212 and thereby further reduces reverse leakage current.

The negative charge of the insulating layer 232 is fixed charge. Unlike negative charge by the interface state, this allows for depletion on the surface of the semiconductor layer 212 without delay relative to application of a voltage.

Similar modifications to those of the first embodiment may be applied to the semiconductor device 200 of the second embodiment. For example, in the insulating film 230, not the insulating layer 232 but the insulating layer 234 may be an insulating layer mainly made of negatively charged microcrystal.

C. Third Embodiment

Figure 8:
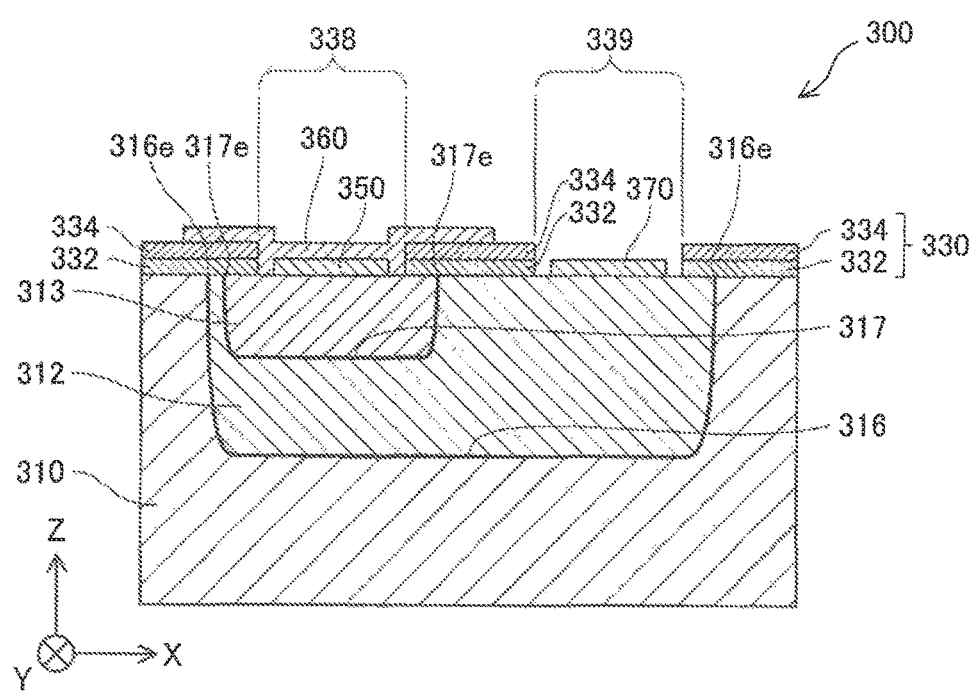
FIG. 8 is a sectional view schematically illustrating the structure of a semiconductor device according to a third embodiment.

FIG. 8 is a sectional view schematically illustrating the structure of a semiconductor device 300 according to a third embodiment. As in FIG. 1, XYZ axes are illustrated in FIG. 8. According to this embodiment, the semiconductor device 300 is a GaN-based semiconductor device formed by using gallium nitride (GaN). According to this embodiment, the semiconductor device 300 is a planar pn junction diode. According to this embodiment, the semiconductor device 300 is used for power control and is also called power device. The semiconductor device 300 includes a substrate 310, a semiconductor layer 312, a semiconductor layer 313, an insulating film 330, an anode electrode 350, a field plate electrode 360 and a cathode electrode 370.

The substrate 310 of the semiconductor device 300 is a semiconductor formed in a plate-like shape extended along both the X axis and the Y axis. According to this embodiment, the substrate 310 is mainly made of gallium nitride (GaN). According to this embodiment, the substrate 310 is a p-type semiconductor containing magnesium (Mg) as the acceptor element.

The semiconductor layer 312 of the semiconductor device 300 is an n-type semiconductor formed by ion implantation in part of the +Z-axis direction side of the substrate 310. According to this embodiment, the semiconductor layer 312 is mainly made of gallium nitride (GaN). According to this embodiment, the semiconductor layer 312 contains silicon (Si) as the donor element.

The semiconductor layer 313 of the semiconductor device 300 is a p-type semiconductor formed by ion implantation in part of the +Z-axis direction side of the semiconductor layer 312. According to this embodiment, the semiconductor layer 313 is mainly made of gallium nitride (GaN). According to this embodiment, the semiconductor layer 313 is a p-type semiconductor containing magnesium (Mg) as the acceptor element.

A pn junction 316 is formed between the substrate 310 and the semiconductor layer 312. The pn junction 316 is an interface at which the substrate 310 of the p-type semiconductor is in junction with the semiconductor layer 312 of the n-type semiconductor. The pn junction 317 has an end 317e exposed on the +Z-axis direction side.

A pn junction 317 is formed between the semiconductor layer 312 and the semiconductor layer 313. The pn junction 317 is an interface at which the semiconductor layer 312 of the n-type semiconductor is in junction with the semiconductor layer 313 of the p-type semiconductor. The pn junction 317 has an end 317e exposed on the +Z-axis direction side.

The insulating film 330 of the semiconductor device 300 is a film that has electrical insulation properties and is formed on the +Z-axis direction side surfaces of the substrate 310 and the semiconductor layers 312 and 313. The insulating film 330 serves as a passivating film to protect the surface of the substrate 310, the surfaces of the semiconductor layers 312 and 313, the end 316e of the pn junction 316 and the end 317e of the pn junction 317 and is arranged to cover the respective surfaces of the substrate 310 and the semiconductor layers 312 and 313. The insulating film 330 includes an insulating layer 332 and an insulating layer 334.

The insulating layer 332 of the insulating film 330 is an insulating layer mainly made of negatively charged microcrystal, like the insulating layer 232 of the second embodiment. According to this embodiment, the insulating layer 332 is mainly made of aluminum oxide ($Al_2O_3$) that is an oxide of aluminum (Al). According to this embodiment, the insulating layer 332 is formed on the respective +Z-axis direction surfaces of the substrate 310 and the semiconductor layers 312 and 313 to be adjacent to the end 316e of the pn junction 316 and adjacent to the end 317e of the pn junction 317. According to this embodiment, the insulating layer 332 has thickness of about 100 nm. According to this embodiment, the insulating layer 332 is a film of insulating layer formed by atomic layer deposition (ALD) and subsequently subjected to anneal treatment. According to this embodiment, the conditions of anneal treatment of the insulating layer 332 are nitrogen ($N_2$) atmosphere, anneal treatment temperature of 400° C. and anneal treatment time of 30 minutes.

The insulating layer 334 of the insulating film 330 is another insulating film formed on the insulating layer 332 and mainly made of an amorphous material. According to this embodiment, the insulating layer 334 is mainly made of silicon dioxide ($SiO_2$). According to this embodiment, the insulating layer 334 has thickness of about 500 nm. According to this embodiment, the insulating layer 334 is a film of insulating layer formed by plasma chemical vapor deposition (plasma CVD).

The insulating film 330 has an opening 338 formed to pass through the insulating film 330 and to be extended to the +Z-axis direction side surface of the semiconductor layer 313. The opening 338 is a structure formed by removing part of the insulating film 330 from on the semiconductor layer 313 to make the semiconductor layer 313 exposed by wet etching.

The insulating film 330 also has an opening 339 formed to pass through the insulating film 330 and to be extended to the +Z-axis direction side surface of the semiconductor layer 312. The opening 339 is a structure formed by removing part of the insulating film 330 from on the semiconductor layer 312 to make the semiconductor layer 312 exposed by wet etching.

The anode electrode 350 of the semiconductor device 300 is an ohmic electrode that is made of an electrically conductive material and is in ohmic junction with the +Z-axis direction side of the semiconductor layer 313. The anode electrode 350 is located inside of the opening 338 of the insulating film 330. According to this embodiment, the anode electrode 350 is an electrode formed by stacking a layer made of gold (Au) on a layer made of nickel (Ni) by electron beam evaporation and subsequently subjected to annealing process (anneal treatment).

The field plate electrode 360 of the semiconductor device 300 is an electrode made of an electrically conductive material and extended from inside of the opening 338 of the insulating film 330 including on the anode electrode 350 to on the insulating film 330. Field plate structures are accordingly formed between the field plate electrode 360 and the end 316e of the pn junction 316 and the end 317e of the pn junction 317 across the insulating film 330. According to this embodiment, the field plate electrode 360 is an electrode formed by electron beam evaporation and is mainly made of aluminum (Al).

The cathode electrode 370 of the semiconductor device 300 is an ohmic electrode that is made of an electrically conductive material and is in ohmic junction with the +Z-axis direction side of the semiconductor layer 312 inside of the opening 339 of the insulating film 330. According to this embodiment, the cathode electrode 370 is an electrode formed by stacking a layer made of aluminum (Al) on a layer made of titanium (Ti) by electron beam evaporation and subsequently subjected to annealing process (anneal treatment).

In the third embodiment described above, the negative charge in the insulating layer 332 mainly made of microcrystal in the insulating film 330 causes depletion on the surface of the semiconductor layer 312. This sufficiently reduces the potential crowding on the surface of the semiconductor layer 312 near to the end 317e of the pn junction 317 and thereby sufficiently reduces the reverse leakage current.

The insulating layer 332 is formed adjacent to the semiconductor layer 312. Compared with a structure that the insulating layer 332 is formed away from the semiconductor layer 312, this structure further enhances depletion on the surface of the semiconductor layer 312 by the negative charge of the insulating layer 332. This accordingly further reduces the potential crowding on the surface of the semiconductor layer 312 and thereby further reduces reverse leakage current.

The negative charge of the insulating layer 332 is fixed charge. Unlike negative charge by the interface state, this allows for depletion on the surface of the semiconductor layer 312 without delay relative to application of a voltage.

Similar modifications to those of the first embodiment may be applied to the semiconductor device 300 of the third embodiment. For example, in the insulating film 330, not the insulating layer 332 but the insulating layer 334 may be an insulating layer mainly made of negatively charged microcrystal.

D. Fourth Embodiment

Figure 9:
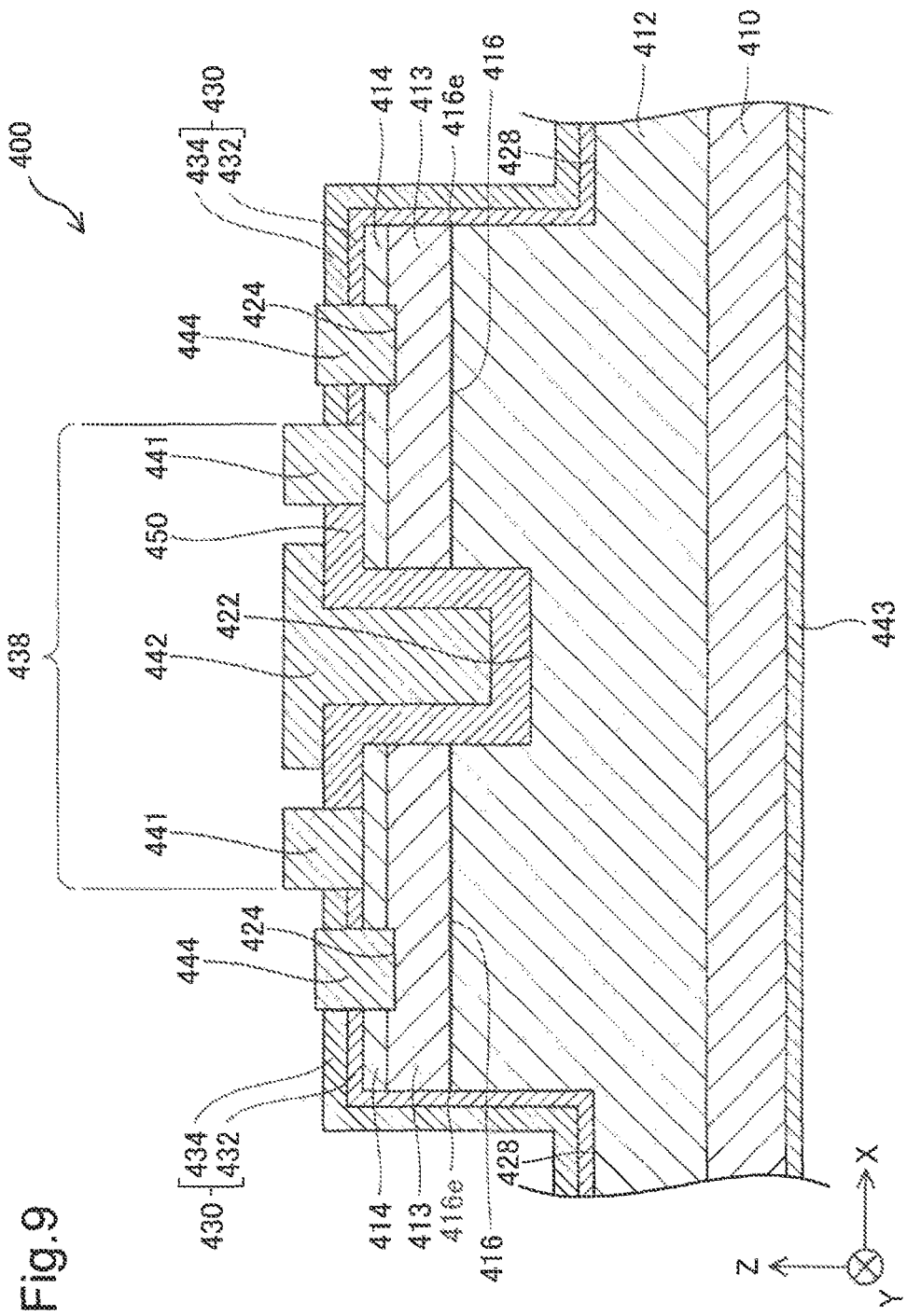
FIG. 9 is a sectional view schematically illustrating the structure of a semiconductor device according to a fourth embodiment.

FIG. 9 is a sectional view schematically illustrating the structure of a semiconductor device 400 according to a fourth embodiment. As in FIG. 1, XYZ axes are illustrated in FIG. 9. According to this embodiment, the semiconductor device 400 is a GaN-based semiconductor device formed by using gallium nitride (GaN). According to this embodiment, the semiconductor device 400 is a vertical trench MOSFET (metal oxide semiconductor field effect transistor). According to this embodiment, the semiconductor device 400 is used for power control and is also called power device. The semiconductor device 400 includes a substrate 410, a semiconductor layer 412, a semiconductor layer 413, a semiconductor layer 414, an insulating film 430, a source electrode 441, a gate electrode 442, a drain electrode 443, a body electrode 444 and a gate insulating film 450.

The substrate 410 of the semiconductor device 400 is a semiconductor formed in a plate-like shape extended along both the X axis and the Y axis. According to this embodiment, the substrate 410 is mainly made of gallium nitride (GaN). According to this embodiment, the substrate 410 is an n-type semiconductor containing silicon (Si) as the donor element.

The semiconductor layer 412 of the semiconductor device 400 is an n-type semiconductor layer located on the +Z-axis direction side of the substrate 410 and extended along the X axis and the Y axis. According to this embodiment, the semiconductor layer 412 is mainly made of gallium nitride (GaN). According to this embodiment, the semiconductor layer 412 contains silicon (Si) as the donor element at a lower concentration than that in the substrate 410. According to this embodiment, the semiconductor layer 412 is a semiconductor layer formed by metal organic chemical vapor deposition (MOCVD).

The semiconductor layer 413 of the semiconductor device 400 is a p-type semiconductor layer located on the +Z-axis direction side of the semiconductor layer 412 and extended along the X axis and the Y axis. According to this embodiment, the semiconductor layer 413 is mainly made of gallium nitride (GaN). According to this embodiment, the semiconductor layer 413 contains magnesium (Mg) as the acceptor element. According to this embodiment, the semiconductor layer 413 is a semiconductor layer formed by metal organic chemical vapor deposition (MOCVD).

The semiconductor layer 414 of the semiconductor device 400 is an n-type semiconductor layer located on the +Z-axis direction side of the semiconductor layer 413 and extended along the X axis and the Y axis. According to this embodiment, the semiconductor layer 414 is mainly made of gallium nitride (GaN). According to this embodiment, the semiconductor layer 414 contains silicon (Si) as the donor element at a higher concentration than that in the semiconductor layer 412. According to this embodiment, the semiconductor layer 414 is a semiconductor layer formed by metal organic chemical vapor deposition (MOCVD).

The semiconductor device 400 has a stepped portion 428 that is recessed from the +Z-axis direction side of the semiconductor layer 414 through the semiconductor layer 413 into the semiconductor layer 412 in the thickness direction (Z-axis direction). The stepped portion 428 is provided as an element isolation structure (trench isolation structure) to isolate the semiconductor device 400 from another semiconductor device. According to this embodiment, the stepped portion 428 is a structure formed by removing part of the semiconductor layers 412, 413 and 414 formed on the substrate 410 by dry etching.

A pn junction 416 is formed between the semiconductor layer 412 and the semiconductor layer 413. The pn junction 416 is an interface at which the semiconductor layer 412 of the n-type semiconductor is in junction with the semiconductor layer 413 of the p-type semiconductor. The pn junction 416 has an end 416e exposed on the stepped portion 428.

The insulating film 430 of the semiconductor device 400 is a film that has electrical insulation properties and is formed from the stepped portion 428 to the +Z-axis direction side surface of the semiconductor layer 414. According to this embodiment, the insulating film 430 serves as a passivating film to protect the surfaces of the semiconductor layers 412, 413 and 414 and is arranged to cover the surfaces of the semiconductor layers 412, 413 and 414. The insulating film 430 includes an insulating layer 432 and an insulating layer 434.

The insulating layer 432 of the insulating film 430 is an insulating layer mainly made of negatively charged microcrystal. According to this embodiment, the insulating layer 432 is mainly made of zirconium oxide ($ZrO_2$) that is an oxide of zirconium (Zr). According to this embodiment, the insulating layer 432 is formed from the stepped portion 428 to the +Z-axis direction side surface of the semiconductor layer 414 to be adjacent to the end 416e of the pn junction 416. According to this embodiment, the insulating layer 432 has thickness of about 100 nm. According to this embodiment, the insulating layer 432 is a film of insulating layer formed by electron cyclotron resonance sputtering (ECR sputtering) and subsequently subjected to anneal treatment. According to this embodiment, the conditions of anneal treatment of the insulating layer 432 are nitrogen ($N_2$) atmosphere, anneal treatment temperature of 550° C. and anneal treatment time of 5 minutes.

The insulating layer 434 of the insulating film 430 is another insulating film formed on the insulating layer 432 and mainly made of an amorphous material. According to this embodiment, the insulating layer 434 is mainly made of silicon dioxide ($SiO_2$). According to this embodiment, the insulating layer 434 has thickness of about 900 nm. According to this embodiment, the insulating layer 434 is a film of insulating layer formed by plasma chemical vapor deposition (plasma CVD).

The insulating film 430 has an opening 438 formed to pass through the insulating film 430 and to be extended to the +Z-axis direction side surface of the semiconductor layer 414. The opening 438 is a structure formed by removing part of the insulating film 430 from on the semiconductor layer 414 to make the semiconductor layer 414 exposed by wet etching.

The source electrode 441 of the semiconductor device 400 is an ohmic electrode that is made of an electrically conductive material and is in ohmic junction with the +Z-axis direction side of the semiconductor layer 414 inside of the opening 438. According to this embodiment, the source electrode 441 is an electrode formed by stacking a layer made of aluminum (Al) on a layer made of titanium (Ti) by electron beam evaporation and subsequently subjected to annealing process (anneal treatment).

The semiconductor device 400 has a trench 422 formed on the inner side of the source electrode 441 inside of the opening 438. The trench 422 is a concave that is recessed from the +Z-axis direction side of the semiconductor layer 414 through the semiconductor layer 413 into the semiconductor layer 412 in the thickness direction (Z-axis direction). According to this embodiment, the trench 422 is a structure formed by removing part of the semiconductor layers 412, 413 and 414 formed on the substrate 410 by dry etching.

The gate insulating film 450 of the semiconductor device 400 is a film that has electrical insulation properties and is formed inside of the opening 438 to be extended from the trench 422 to the +Z-axis direction side surface of the semiconductor layer 414. According to this embodiment, the gate insulating film 450 is formed by atomic layer deposition (ALD) and is mainly made of silicon dioxide ($SiO_2$).

The gate electrode 442 of the semiconductor device 400 is an electrode formed in the trench 422 via the gate insulating film 450. When a voltage is applied to the gate electrode 442, an inversion layer is formed in the semiconductor layer 413. This inversion layer serves as a channel to form a conductive path between the source electrode 441 and the drain electrode 443. According to this embodiment, the gate electrode 442 is formed by electron beam evaporation and is mainly made of aluminum (Al).

The drain electrode 443 of the semiconductor device 400 is an ohmic electrode that is made of an electrically conductive material and is in ohmic junction with the −Z-axis direction side of the substrate 410. According to this embodiment, the drain electrode 443 is an electrode formed by stacking a layer made of aluminum (Al) on a layer made of titanium (Ti) by electron beam evaporation and subsequently subjected to annealing process (anneal treatment).

The semiconductor device 400 has a recess 424 formed between the stepped portion 428 and the opening 438. The recess 424 is a concave that is recessed through the insulating film 430 and the semiconductor layer 414 into the semiconductor layer 413. According to this embodiment, the recess 424 is a structure formed by removing part of the insulating film 430, the semiconductor layer 414 and the semiconductor layer 413 by etching.

The body electrode 444 of the semiconductor device 400 is an ohmic electrode that is formed in the recess 424 and is in ohmic junction with the semiconductor layer 413. According to this embodiment, the body electrode 444 is an electrode formed by stacking a layer made of gold (Au) on a layer made of palladium (Pd) by electron beam evaporation and subsequently subjected to annealing process (anneal treatment).

In the fourth embodiment described above, the negative charge in the insulating layer 432 mainly made of microcrystal in the insulating film 430 causes depletion on the surface of the semiconductor layer 412. This sufficiently reduces the potential crowding on the surface of the semiconductor layer 412 near to the end 416e of the pn junction 416 and thereby sufficiently reduces the reverse leakage current.

The insulating layer 432 is formed adjacent to the semiconductor layer 412. Compared with a structure that the insulating layer 432 is formed away from the semiconductor layer 412, this structure further enhances depletion on the surface of the semiconductor layer 412 by the negative charge of the insulating layer 432. This accordingly further reduces the potential crowding on the surface of the semiconductor layer 412 and thereby further reduces reverse leakage current.

The negative charge of the insulating layer 432 is fixed charge. Unlike negative charge by the interface state, this allows for depletion on the surface of the semiconductor layer 412 without delay relative to application of a voltage.

Similar modifications to those of the first embodiment may be applied to the semiconductor device 400 of the fourth embodiment. For example, in the insulating film 430, not the insulating layer 432 but the insulating layer 434 may be an insulating layer mainly made of negatively charged microcrystal.

E. Fifth Embodiment

Figure 10:
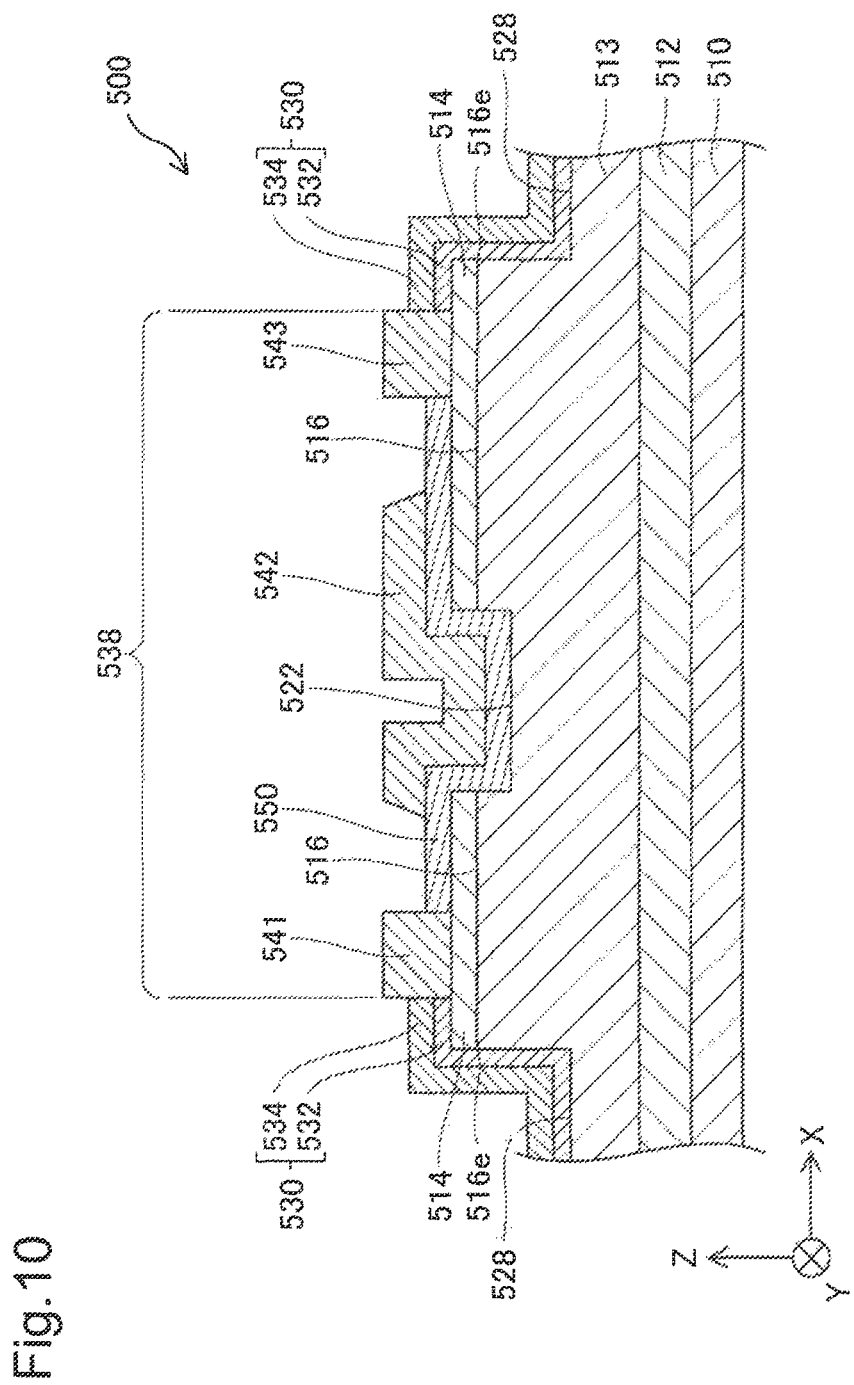
FIG. 10 is a sectional view schematically illustrating the structure of a semiconductor device according to a fifth embodiment.

FIG. 10 is a sectional diagram schematically illustrating the structure of a semiconductor device 500 according to a fifth embodiment. As in FIG. 1, XYZ axes are illustrated in FIG. 10. According to this embodiment, the semiconductor device 500 is a GaN-based semiconductor device formed by using gallium nitride (GaN). According to this embodiment, the semiconductor device 500 is a lateral MISFET (metal insulator semiconductor field effect transistor) having a recessed structure. According to this embodiment, the semiconductor device 500 is used for power control and is also called power device. The semiconductor device 500 includes a substrate 510, a semiconductor layer 512, a semiconductor layer 513, a semiconductor layer 514, an insulating film 530, a source electrode 541, a gate electrode 542, a drain electrode 543 and an insulating film 550.

The substrate 510 of the semiconductor device 500 is a semiconductor formed in a plate-like shape extended along both the X axis and the Y axis. According to this embodiment, the substrate 510 is mainly made of silicon (Si).

The semiconductor layer 512 of the semiconductor device 500 is a buffer layer located on the +Z-axis direction side of the substrate 510 and extended along the X axis and the Y axis. According to this embodiment, the semiconductor has a multi-layered structure that a relatively thick undoped layer mainly made of gallium nitride (GaN) is stacked on a relatively thin undoped layer mainly made of aluminum nitride (AlN). According to this embodiment, the semiconductor layer 512 is a semiconductor layer formed by metal organic chemical vapor deposition (MOCVD).

The semiconductor layer 513 of the semiconductor device 500 is a carrier transport layer located on the +Z-axis direction side of the semiconductor layer 512 and extended along the X axis and the Y axis. According to this embodiment, the semiconductor layer 513 is an undoped layer mainly made of gallium nitride (GaN). According to this embodiment, the semiconductor layer 513 is a semiconductor layer formed by metal organic chemical vapor deposition (MOCVD).

The semiconductor layer 514 of the semiconductor device 500 is a barrier layer located on the +Z-axis direction side of the semiconductor layer 513 and extended along the X axis and the Y axis. According to this embodiment, the semiconductor layer 514 is an undoped layer mainly made of aluminum gallium nitride ($Al_{0.25}Ga_{0.75}N$). The semiconductor layer 514 has a wider band gap than the semiconductor layer 513 that is the carrier transport layer, and serves to supply the carrier to the semiconductor layer 513. A two-dimensional gas is generated on the semiconductor layer 513-side at a hetero-junction interface 516 of the semiconductor layer 513 and the semiconductor layer 514 by the effect of positive polarization charge. According to this embodiment, the semiconductor layer 514 is a semiconductor layer formed by metal organic chemical vapor deposition (MOCVD).

The material of the semiconductor layer 514 is not limited to aluminum gallium nitride (AlGaN) but may be another nitride such as aluminum indium nitride (AlInN) or aluminum indium gallium nitride (AlGaInN). The semiconductor layer 514 is not necessarily the undoped layer but may be a doped layer. The semiconductor layer 514 does not necessarily have the single-layered structure but may be a semiconductor layer comprised of a plurality of semiconductor layers having difference in at least one of the material and the doping concentration. The semiconductor layer 514 may have a multi-layered structure, for example, GaN/AlGaN, InGaN/AlGaN or InGaN/AlGaN/AlN. According to this embodiment, a structure comprised of another barrier layer and another carrier transport layer may be formed on the semiconductor layer 513 and the semiconductor layer 514.

The semiconductor device 500 has a stepped portion 528 that is recessed from the +Z-axis direction side of the semiconductor layer 514 into the semiconductor layer 513 in the thickness direction (Z-axis direction). The stepped portion 528 is provided as an element isolation structure (trench isolation structure) to isolate the semiconductor device 500 from another semiconductor device. An end 516e of the hetero-junction interface 516 is exposed on the stepped portion 528. According to this embodiment, the stepped portion 528 is a structure formed by removing part of the semiconductor layers 513 and 514 formed on the substrate 510 by dry etching.

The insulating film 530 of the semiconductor device 500 is a film that has electrical insulation properties and is formed from the stepped portion 528 to the +Z-axis direction side surface of the semiconductor layer 514. According to this embodiment, the insulating film 530 serves as a passivating film to protect the surfaces of the semiconductor layers 513 and 514 and is arranged to cover the surfaces of the semiconductor layers 513 and 514. The insulating film 530 includes an insulating layer 532 and an insulating layer 534.

The insulating layer 532 of the insulating film 530 is an insulating layer mainly made of negatively charged microcrystal. According to this embodiment, the insulating layer 532 is mainly made of hafnium oxide ($HfO_2$) that is an oxide of hafnium (Hf). According to this embodiment, the insulating layer 532 is formed from the stepped portion 528 to the +Z-axis direction side surface of the semiconductor layer 514 to be adjacent to the end 516e of the hetero-junction interface 516. According to this embodiment, the insulating layer 532 has thickness of about 100 nm. According to this embodiment, the insulating layer 532 is a film of insulating layer formed by atomic layer deposition (ALD) and subsequently subjected to anneal treatment. According to this embodiment, the conditions of anneal treatment of the insulating layer 532 are nitrogen ($N_2$) atmosphere, anneal treatment temperature of 400° C. and anneal treatment time of 30 minutes.

The insulating layer 534 of the insulating film 530 is another insulating film formed on the insulating layer 532 and mainly made of an amorphous material. According to this embodiment, the insulating layer 534 is mainly made of silicon dioxide ($SiO_2$). According to this embodiment, the insulating layer 534 has thickness of about 900 nm. According to this embodiment, the insulating layer 534 is a film of insulating layer formed by plasma chemical vapor deposition (plasma CVD).

The insulating film 530 has an opening 538 formed to pass through the insulating film 530 and to be extended to the +Z-axis direction side surface of the semiconductor layer 514. The opening 538 is a structure formed by removing part of the insulating film 530 from on the semiconductor layer 514 to make the semiconductor layer 514 exposed by wet etching.

The source electrode 541 of the semiconductor device 500 is an ohmic electrode that is made of an electrically conductive material and is in ohmic junction with the +Z-axis direction side of the semiconductor layer 514 inside of the opening 538. According to this embodiment, the source electrode 541 is an electrode formed by stacking a layer made of aluminum (Al) on a layer made of titanium (Ti) by electron beam evaporation and subsequently subjected to annealing process (anneal treatment).

The semiconductor device 500 has a recess 522 formed on the inner side of the source electrode 541 inside of the opening 538. The recess 522 is a concave that is recessed from the +Z-axis direction side of the semiconductor layer 514 into the semiconductor layer 513 in the thickness direction (Z-axis direction). The recess 522 has a depth set such that a two-dimensional electron gas between the source electrode 541 and the gate electrode 542 is sufficiently separated from a two-dimensional electron gas between the gate electrode 542 and the drain electrode 543 under application of no gate voltage to the gate electrode 542. This achieves a normally-off state to reduce electric current flowing between the source electrode 541 and the drain electrode 543 under application of no gate voltage to the gate electrode 542. According to this embodiment, the recess 522 is a structure formed by removing part of the semiconductor layers 513 and 514 formed on the substrate 510 by dry etching.

The drain electrode 543 of the semiconductor device 500 is an ohmic electrode that is made of an electrically conductive material, is located on the opposite side to the source electrode 541 across the recess 522 and the gate electrode 542 inside of the opening 538 and is in ohmic junction with the +Z-axis direction side of the semiconductor layer 514. According to this embodiment, the drain electrode 543 is an electrode formed by stacking a layer made of aluminum (Al) on a layer made of titanium (Ti) by electron beam evaporation and subsequently subjected to annealing process (anneal treatment).

The insulating film 550 of the semiconductor device 500 is a film that has electrical insulation properties and is formed to be extended from the recess 522 to the +Z-axis direction side surface of the semiconductor layer 514. According to this embodiment, the insulating film 550 is formed by atomic layer deposition (ALD) and is mainly made of silicon dioxide ($SiO_2$).

The gate electrode 542 of the semiconductor device 500 is an electrode formed in the recess 522 via the insulating film 550. According to this embodiment, the gate electrode 542 is formed by electron beam evaporation and is mainly made of aluminum (Al).

In the fifth embodiment described above, the negative charge in the insulating layer 532 mainly made of microcrystal in the insulating film 530 causes depletion on the surface of the semiconductor layer 513. This sufficiently reduces the potential crowding on the surface of the semiconductor layer 513 near to the end 516e of the hetero-junction interface 516 and thereby sufficiently reduces the reverse leakage current.

The insulating layer 532 is formed adjacent to the semiconductor layer 513. Compared with a structure that the insulating layer 532 is formed away from the semiconductor layer 513, this structure further enhances depletion on the surface of the semiconductor layer 513 by the negative charge of the insulating layer 532. This accordingly further reduces the potential crowding on the surface of the semiconductor layer 513 and thereby further reduces reverse leakage current.

The negative charge of the insulating layer 532 is fixed charge. Unlike negative charge by the interface state, this allows for depletion on the surface of the semiconductor layer 513 without delay relative to application of a voltage.

Similar modifications to those of the first embodiment may be applied to the semiconductor device 500 of the fifth embodiment. For example, in the insulating film 530, not the insulating layer 532 but the insulating layer 534 may be an insulating layer mainly made of negatively charged microcrystal.

F. Sixth Embodiment

Figure 11:
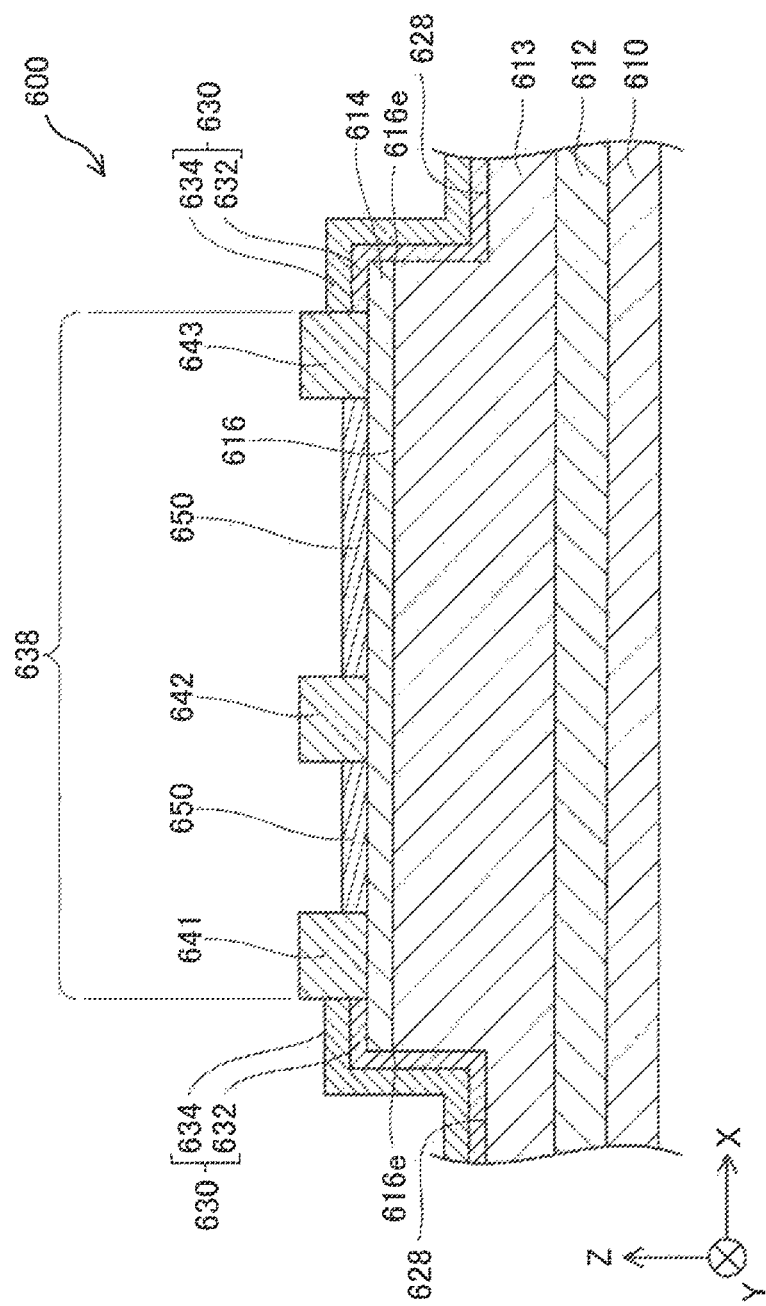
FIG. 11 is a sectional view schematically illustrating the structure of a semiconductor device according to a sixth embodiment.

FIG. 11 is a sectional diagram schematically illustrating the structure of a semiconductor device 600 according to a sixth embodiment. As in FIG. 1, XYZ axes are illustrated in FIG. 11. According to this embodiment, the semiconductor device 600 is a GaN-based semiconductor device formed by using gallium nitride (GaN). According to this embodiment, the semiconductor device 600 is a lateral HEFT (hetero-structure field effect transistor). According to this embodiment, the semiconductor device 600 is used for power control and is also called power device. The semiconductor device 600 includes a substrate 610, a semiconductor layer 612, a semiconductor layer 613, a semiconductor layer 614, an insulating film 630, a source electrode 641, a gate electrode 642, a drain electrode 643 and an insulating film 650.

The substrate 610 of the semiconductor device 600 is similar to the substrate 510 of the fifth embodiment. The semiconductor layers 612, 613 and 614 of the semiconductor device 600 are similar to the semiconductor layers 512, 513 and 514 of the fifth embodiment, except omission of the recess 522. A hetero-junction interface 616 is formed between the semiconductor layer 613 and the semiconductor layer 614. The semiconductor device 600 has a stepped portion 628 that is similar to the stepped portion 528 of the fifth embodiment. An end 616e of the hetero-junction interface 616 is exposed on the stepped portion 628.

The insulating film 630 of the semiconductor device 600 is similar to the insulating film 530 of the fifth embodiment and includes an insulating layer 632 and an insulating layer 634. The insulating layer 632 of the insulating film 630 is an insulating layer mainly made of negatively charged microcrystal, like the insulating layer 532 of the fifth embodiment. The insulating layer 634 of the insulating film 630 is another insulating film mainly made of an amorphous material, like the insulating layer 534 of the fifth embodiment. The insulating film 630 has an opening 638 that is similar to the opening 538 of the fifth embodiment.

The source electrode 641 of the semiconductor device 600 is similar to the source electrode 541 of the fifth embodiment. The source electrode 641 is an ohmic electrode that is in ohmic junction with the +Z-axis direction side of the semiconductor layer 614 inside of the opening 638.

The drain electrode 643 of the semiconductor device 600 is similar to the drain electrode 543 of the fifth embodiment. The drain electrode 643 is an ohmic electrode that is located on the opposite side to the source electrode 641 across the gate electrode 642 inside of the opening 638 and is in ohmic junction with the +Z-axis direction side of the semiconductor layer 614.

The gate electrode 642 of the semiconductor device 600 is an ohmic electrode that is located between the source electrode 641 and the drain electrode 643 inside of the opening 638 and is in ohmic junction with the +Z-axis direction side of the semiconductor layer 614. According to this embodiment, the gate electrode 642 is an electrode formed by stacking a layer made of aluminum (Al) on a layer made of titanium (Ti) by electron beam evaporation and subsequently subjected to annealing process (anneal treatment).

The insulating film 650 of the semiconductor device 600 is a film that has electrical insulation properties and is formed over the +Z-axis direction side surface of the semiconductor layer 614 inside of the opening 638. The insulating film 650 is formed between the source electrode 641 and the gate electrode 642 and between the gate electrode 642 and the drain electrode 643. According to this embodiment, the insulating film 650 is formed by atomic layer deposition (ALD) and is mainly made of silicon dioxide ($SiO_2$).

In the sixth embodiment described above, the negative charge in the insulating layer 632 mainly made of microcrystal in the insulating film 630 causes depletion on the surface of the semiconductor layer 613. This sufficiently reduces the potential crowding on the surface of the semiconductor layer 613 near to the end 616e of the hetero-junction interface 616 and thereby sufficiently reduces the reverse leakage current.

The insulating layer 632 is formed adjacent to the semiconductor layer 613. Compared with a structure that the insulating layer 632 is formed away from the semiconductor layer 613, this structure further enhances depletion on the surface of the semiconductor layer 613 by the negative charge of the insulating layer 632. This accordingly further reduces the potential crowding on the surface of the semiconductor layer 613 and thereby further reduces reverse leakage current.

The negative charge of the insulating layer 632 is fixed charge. Unlike negative charge by the interface state, this allows for depletion on the surface of the semiconductor layer 613 without delay relative to application of a voltage.

Similar modifications to those of the first embodiment may be applied to the semiconductor device 600 of the sixth embodiment. For example, in the insulating film 630, not the insulating layer 632 but the insulating layer 634 may be an insulating layer mainly made of negatively charged microcrystal.

G. Other Embodiments

The invention is not limited to any of the embodiments, the examples and the modifications described above but may be implemented by a diversity of other configurations without departing from the scope of the invention. For example, the technical features of any of the embodiments, examples and modifications corresponding to the technical features of each of the aspects described in Summary may be replaced or combined appropriately, in order to solve part or all of the problems described above or in order to achieve part or all of the advantageous effects described above. Any of the technical features may be omitted appropriately unless the technical feature is described as essential herein.

The semiconductor device which the invention is applied to is not limited to the semiconductor devices described in the above embodiments but may be any semiconductor device that has an insulating film on a site where potential crowding arises, for example, MESFET (metal semiconductor field effect transistor) or insulating gate bipolar transistor (IGBT).

In the embodiments described above, the material of the substrate is not limited to gallium nitride (GaN) but may be, for example, any of silicon (Si), sapphire ($Al_2O_3$) and silicon carbide (SiC). In the embodiments described above, the material of each semiconductor layer is not limited to gallium nitride (GaN) but may be, for example, any of silicon (Si), germanium (Ge), group III-V compounds (for example, gallium arsenide (GaAs) and indium phosphide (InP)), silicon carbide (SiC), gallium oxide ($Ga_2O_3$) and wideband gap semiconductor (for example, diamond).

In the embodiments described above, the donor element included in the n-type semiconductor layer is not limited to silicon (Si) but may be, for example, germanium (Ge) or oxygen (O).

In the embodiments described above, the acceptor element included in the p-type semiconductor layer is not limited to magnesium (Mg) but may be, for example, zinc (Zn) or carbon (C).

In the embodiments described above, the insulating film is required to include one or multiple insulating layers mainly made of negatively charged microcrystal and may have a single-layered structure or a multi-layered structure. In the embodiments described above, the material of the insulating layer mainly made of negatively charged microcrystal is not limited to the materials described above but may be any material that has high relative permittivity (for example, 6 or higher) and is readily crystallized. The material of the insulating layer mainly made of negatively charged microcrystal is not limited to the oxide but may be a nitride or a silicide (for example, aluminum oxynitride (AlON), zirconium oxynitride (ZrON) or hafnium silicon oxynitride (HfSiON)). The oxide is, however, preferable as the material of the insulating layer mainly made of negatively charged microcrystal, in terms of easy crystallization by anneal treatment.

What is claimed is:

1. A semiconductor device comprising:
   a substrate;
   a semiconductor layer that is formed on the substrate and includes a pn junction or a hetero-junction;
   an insulating film that is formed on the semiconductor layer to be in contact with an end of the pn junction or an end of the hetero-junction; and an electrode formed on the semiconductor layer,
wherein the insulating film includes:
- a first insulating layer that is mainly made of negatively charged microcrystal; and
- a second insulating layer mainly made of an amorphous material, which is situated on the first insulating layer or between the semiconductor layer and the first insulating layer.

2. The semiconductor device according to claim 1,
wherein the semiconductor layer includes a stepped portion that is recessed in a thickness direction, with the end of the pn junction or the end of the hetero-junction exposed therein, and
wherein the insulating film covers the end of the pn junction or the end of the hetero-junction that is exposed in the stepped portion.

3. The semiconductor device according to claim 2,
wherein the stepped portion is provided as an element isolation structure to isolate the semiconductor device from another semiconductor device.

4. The semiconductor device according to claim 1, wherein the semiconductor device comprises a vertical semiconductor device, and further comprises a back electrode that is formed on a backside of the substrate.

5. The semiconductor device according to claim 1,
wherein the insulating film includes an opening through which the semiconductor layer is exposed,
wherein the electrode is formed on the semiconductor layer inside the opening, and
wherein the end of the pn junction or the end of the hetero junction is located outside the opening.

6. The semiconductor device according to claim 5,
wherein the electrode forms a field plate structure that holds the insulating film with the end of the pn junction or the end of the hetero-junction.

7. The semiconductor device according to claim 5,
wherein the electrode comprises a source electrode formed inside the opening.

8. The semiconductor device according to claim 7, further comprising a drain electrode formed on a backside of the substrate.

9. The semiconductor device according to claim 5,
wherein the electrode comprises a gate electrode formed inside the opening.

10. The semiconductor device according to claim 1,
wherein the first insulating layer has a relative permittivity of 6 or greater.

11. The semiconductor device according to claim 1,
wherein the negative charge of the first insulating layer comprises a fixed charge.

12. The semiconductor device according to claim 1,
wherein the first insulating layer is formed to have an absolute value of negative charge density that is equal to or greater than $1\times10^{12}$ cm$^{-2}$.

13. The semiconductor device according to claim 1, wherein the first insulating layer is more likely to be readily crystallized by anneal treatment than the second insulating layer.

* * * * *